(12) United States Patent
Manning

(10) Patent No.: US 8,762,621 B2
(45) Date of Patent: Jun. 24, 2014

(54) LOGICAL UNIT OPERATION

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 515 days.

(21) Appl. No.: 12/259,380

(22) Filed: Oct. 28, 2008

(65) Prior Publication Data

US 2010/0106919 A1 Apr. 29, 2010

(51) Int. Cl.
*G06F 12/00* (2006.01)

(52) U.S. Cl.
USPC ............................ 711/103; 365/185.33

(58) Field of Classification Search
USPC ....................... 711/103; 365/185.33
See application file for complete search history.

(56) References Cited

U.S. PATENT DOCUMENTS

| | | | |
|---|---|---|---|
| 4,342,079 A | 7/1982 | Stewart et al. | |
| 4,965,717 A | 10/1990 | Cutts, Jr. et al. | |
| 5,134,584 A | 7/1992 | Boler et al. | |
| 5,887,270 A | 3/1999 | Brant et al. | |
| 6,256,702 B1 | 7/2001 | Yoneyama | |
| 6,266,273 B1 | 7/2001 | Conley et al. | |
| 6,748,482 B1* | 6/2004 | Fackenthal | 711/103 |
| 6,813,212 B2 | 11/2004 | Takahashi et al. | |
| 6,877,076 B1* | 4/2005 | Cho et al. | 711/157 |
| 2003/0012055 A1 | 1/2003 | Gochi | |
| 2003/0086295 A1 | 5/2003 | Honda et al. | |
| 2004/0095838 A1 | 5/2004 | Li | |
| 2005/0010725 A1 | 1/2005 | Eilert | |
| 2005/0144357 A1* | 6/2005 | Sinclair | 711/103 |
| 2005/0289313 A1* | 12/2005 | Roohparvar | 711/167 |
| 2007/0168624 A1 | 7/2007 | Kaler | |
| 2007/0279988 A1 | 12/2007 | Nguyen | |
| 2007/0283079 A1* | 12/2007 | Iwamura et al. | 711/103 |
| 2008/0082741 A1 | 4/2008 | Biessener et al. | |
| 2008/0113525 A1 | 5/2008 | Tzur | |
| 2008/0189478 A1* | 8/2008 | Chae et al. | 711/103 |
| 2008/0320214 A1* | 12/2008 | Ma et al. | 711/103 |
| 2009/0037652 A1* | 2/2009 | Yu et al. | 711/103 |
| 2009/0089492 A1* | 4/2009 | Yoon et al. | 711/103 |
| 2009/0307389 A1* | 12/2009 | Sprouse et al. | 710/36 |
| 2010/0030946 A1* | 2/2010 | Kano et al. | 711/103 |

FOREIGN PATENT DOCUMENTS

| | | |
|---|---|---|
| CN | 101067969 | 11/2007 |
| JP | 57 152600 A | 9/1982 |
| JP | 06175929 | 6/1994 |
| JP | 2003-140963 | 5/2003 |

OTHER PUBLICATIONS

International Search Report and Written Opinion for related PCT Application PCT/US2009/005600 (12 pgs.).

(Continued)

*Primary Examiner* — Hashem Farrokh

(74) *Attorney, Agent, or Firm* — Brooks, Cameron & Huebsch, PLLC

(57) ABSTRACT

The present disclosure includes methods and devices for logical unit operation. One device embodiment includes a number of logical units, wherein each of the number of logical units has a unique address. The device includes control circuitry coupled to the number of logical units and configured optionally to control more than one of the number of logical units with one of a number of commands and one address.

34 Claims, 8 Drawing Sheets

(56) References Cited

OTHER PUBLICATIONS

Dinkelman, Todd. "SSDs: A Shift in Data Storage," Micron Technology, Inc. Flash Memory Summit, Santa Clara, California, Aug. 2008, accessed at http://www.flashmemorysummit.com/English/Collaterals/Presentations/2008/20080812_F1B_Dinkelman.pdf. (26 pgs.).

Sykes, Justin. "Performance Productivity for Enterprise Applications," Micron Technology, Inc., accessed at http://download.micron.com/pdf/whitepapers/performance_productivity_for_ent_apps.pdf. (5 pgs.).

Sykes, Justin. "SSDs to Boost Data Center Performance," Micron Technology, Inc., accessed at http://download.micron.com/pdf/whitepapers/ssds_to_boost_data_center_performance.pdf. (5 pgs.).

Sykes, Justin. "Reducing Power Consumption in the Data Center with SSDs," Micron Technology, Inc., accessed at http://download.micron.com/pdf/whitepapers/reducing_power_consumption_ssds.pdf (8 pgs.).

European Search Report for related European Application No. 09829426.7, mailed Oct. 4, 2012, (6 pgs.).

Korean Preliminary Rejection for related Korean Application No. 10-2011-7012148, mailed Nov. 30, 2012, (4 pgs.).

Japanese Notice of Rejection for related Japanese Application No. 2011-534484, mailed Mar. 12, 2013, (4 pgs.).

A Korean Office Action in related Korean Application No. 10-2011-7012148. Jun. 27, 2013. 8 pgs.

A Chinese Office Action in related Chinese Application No. 200980148541.6.. May 20, 2013. 22 pgs.

Japanese Decision of Rejection for related Japanese Application No. 2011-534484, dated Aug. 13, 2013, 3 pages.

Office Action from Taiwan patent application No. 098136565, dated Nov. 22, 2013, 19 pp.

Second Office Action from Chinese patent application No. 200980148541.6, dated Dec. 25, 2013, 13 pp.

International Search Report and Written Opinion of international application No. PCT/US2009/005600, dated Apr. 13, 2010, 12 pp.

* cited by examiner

| CYCLE | I/O7 | I/O6 | I/O5 | I/O4 | I/O3 | I/O2 | I/O1 | I/O0 |
|---|---|---|---|---|---|---|---|---|
| FIRST | CA7 | CA6 | CA5 | CA4 | CA3 | CA2 | CA1 | CA0 |
| SECOND | LOW | LOW | LOW | CA12 | CA11 | CA10 | CA9 | CA8 |
| THIRD | BA7 | PA6 | PA5 | PA4 | PA3 | PA2 | PA1 | PA0 |
| FOURTH | BA15 | BA14 | BA13 | BA12 | BA11 | BA10 | BA9 | BA8 |
| FIFTH | LOW | LOW | LOW | LOW | BA19 | BA18 | BA17 | BA16 |

*Fig. 5*

LOGICAL UNIT OPERATION

TECHNICAL FIELD

The present disclosure relates generally to semiconductor memory devices, methods, and systems, and more particularly, to logical unit operation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Solid state memory devices are utilized as volatile and non-volatile memory for a wide range of electronic applications. Flash memory, which is just one type of solid state memory, typically uses a one-transistor memory cell that allows for high memory densities, high reliability, and low power consumption.

Solid state memory devices, including flash devices, can be combined together to form a solid state drive. A solid state drive can be used to replace hard disk drives as the main storage device for a computer, as the solid state drives can have advantages over hard drives in terms of performance, size, weight, ruggedness, operating temperature range, and power consumption. For example, flash solid state drives can have superior performance when compared to magnetic disk drives due to their lack of moving parts, which may ameliorate seek time, latency, and other electromechanical delays associated with magnetic disk drives.

A solid state drive is a data storage device that uses solid state memory to store persistent data. A solid state drive may include NAND flash non-volatile memory and/or DRAM volatile memory. Solid state drive manufacturers can use nonvolatile flash memory to create a drive that does not use an internal battery supply thus allowing the drive to be more versatile and compact. Solid state drives using flash memory, also known as flash drives, can use standard disk drive form factors (e.g., 1.8-inch, 2.5-inch, and 3.5-inch, among others).

For some storage applications, hard drives may be arranged in a redundant array, such as a redundant array of inexpensive disks, also referred to as a redundant array of independent disks (RAID). A RAID can refer to data storage systems that can divide and replicate data among multiple hard disk drives. Such arrangements, e.g., in servers, may be intended to prevent data loss in case a particular drive fails. However, this practice may involve a substantial investment in extra capacity that is not realized in system storage capacity. For example, in some storage applications, as little as 5-30% of a hard disk capacity is used for storage in order to increase performance by reducing seek times associated with the hard disk(s). Furthermore, hard drive failure rates may tend to increase as the drive ages. Solid state devices, conversely, may tend to fail early in life, if at all, and then operate correctly through the end of their expected service life.

BRIEF DESCRIPTION OF THE DRAWINGS

FIG. 5 illustrates a table including an address data arrangement organized into 5 cycles in accordance with one or more embodiments of the present disclosure.

DETAILED DESCRIPTION

Figure 1:
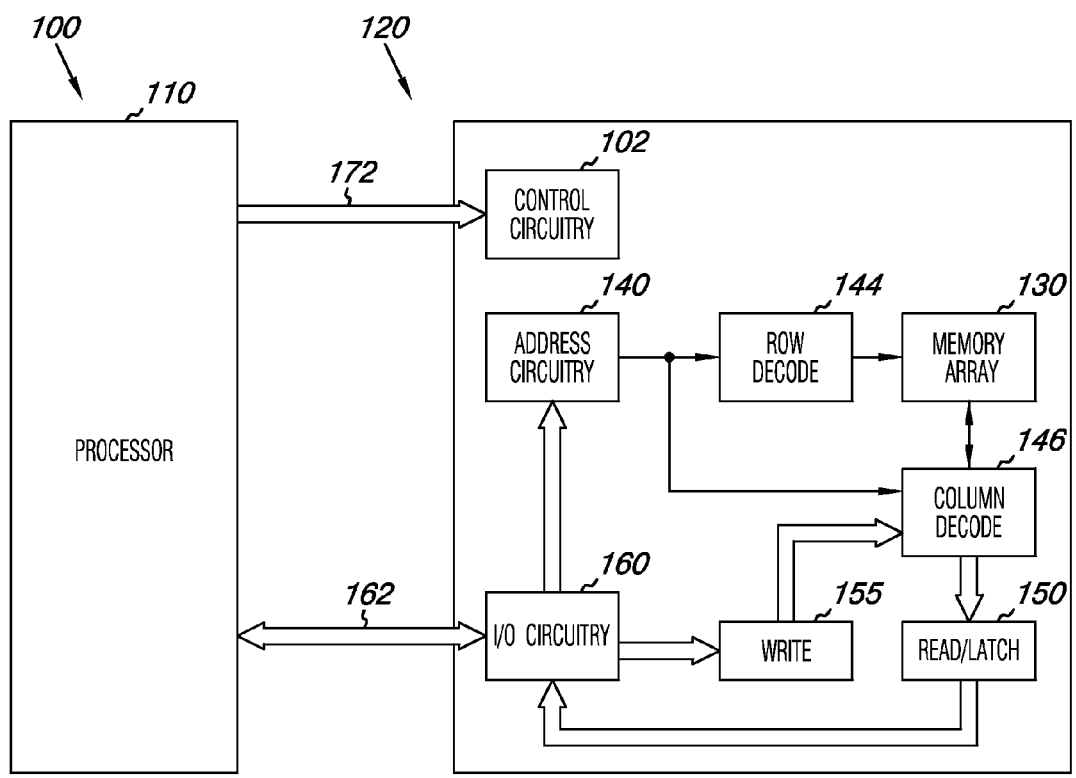
FIG. 1 is a functional block diagram of an electronic memory system having at least one memory device operated in accordance with one or more embodiments of the present disclosure.

The present disclosure includes methods and devices for logical unit operation. One device embodiment includes a number of logical units, wherein each of the number of logical units has a unique address. The device includes control circuitry coupled to the number of logical units and configured optionally to control more than one of the number of logical units with one of a number of commands and one address.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "P," "L," and "B," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of an electronic memory system 100 having at least one memory device 120 operated in accordance with one or more embodiments of the present disclosure. Memory system 100 includes a processor 110 coupled to a non-volatile memory device 120 that includes a memory array 130 of non-volatile cells. The memory system 100 can include separate integrated circuits or both the processor 110 and the memory device 120 can be on the same integrated circuit. The processor 110 can be a microprocessor or some other type of controlling circuitry such as an application-specific integrated circuit (ASIC).

The memory device 120 includes an array of non-volatile memory cells 130, which can be floating gate flash memory cells with a NAND architecture. The control gates of memory cells of a "row" are coupled with a word line, while the drain regions of the memory cells of a "column" are coupled to bit lines. The source regions of the memory cells are coupled to source lines. As will be appreciated by those of ordinary skill in the art, the manner of connection of the memory cells to the bit lines and source lines depends on whether the array is a NAND architecture, a NOR architecture, an AND architecture, or some other memory array architecture.

The embodiment of FIG. 1 includes address circuitry 140 to latch address signals provided over I/O connections 162 through I/O circuitry 160. Address signals are received and decoded by a row decoder 144 and a column decoder 146 to access the memory array 130. In light of the present disclosure, it will be appreciated by those skilled in the art that the number of address input connections depends on the density and architecture of the memory array 130 and that the number of addresses increases with both increased numbers of memory cells and increased numbers of memory blocks and arrays.

The memory device 120 senses data in the memory array 130 by sensing voltage and/or current changes in the memory array columns using sense/buffer circuitry that in this embodiment can be read/latch circuitry 150. The read/latch circuitry 150 can read and latch a page, e.g., a row, of data from the memory array 130. I/O circuitry 160 is included for bi-directional data communication over the I/O connections 162 with the processor 110. Write circuitry 155 is included to write data to the memory array 130.

Control circuitry 170 decodes signals provided by control connections 172 from the processor 110. These signals can include chip signals, write enable signals, and address latch signals that are used to control the operations on the memory array 130, including data sensing, data write, and data erase operations, as described herein. In one or more embodiments, the control circuitry 170 is responsible for executing instructions from the processor 110 to perform the operations according to embodiments of the present disclosure. The control circuitry 170 can be a state machine, a sequencer, or some other type of controller. It will be appreciated by those skilled in the art that additional circuitry and control signals can be provided, and that the memory device detail of FIG. 1 has been reduced to facilitate ease of illustration.

Figure 2A:
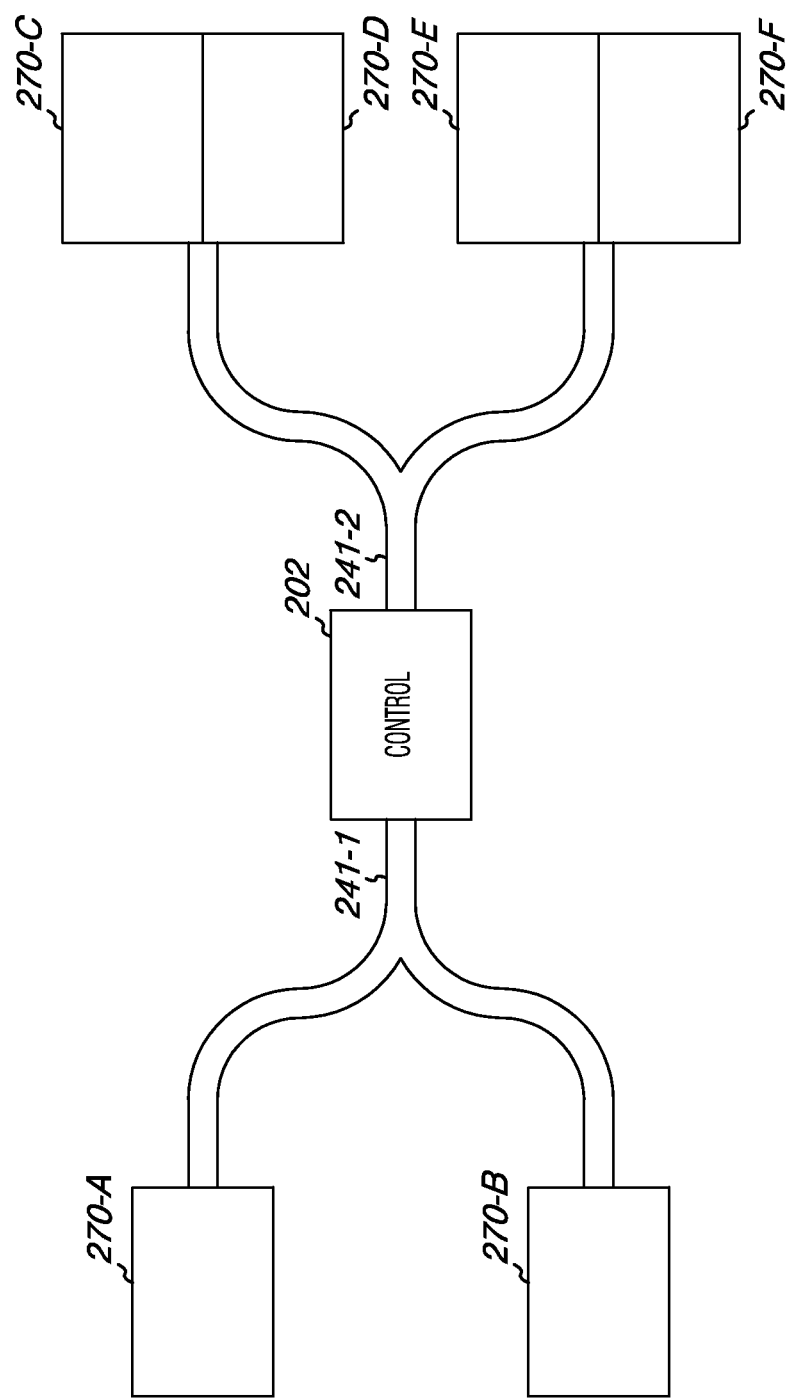
FIG. 2A illustrates a block diagram of logical unit control in accordance with one or more embodiments of the present disclosure.

FIG. 2A illustrates a block diagram of logical unit control in accordance with one or more embodiments of the present disclosure. As used herein, a logical unit can include a group of memory cells, e.g., a die of memory cells, that share a number of control inputs. Control inputs are described in connection with FIGS. 3 and 4, but can generally include address latch enable (ALE), chip enable (CE), read enable (RE), ready/busy (R/B), write protect (WP), and input/output (I/O) connections such as pins, pads, or the like.

The embodiment illustrated in FIG. 2A includes control circuitry 202, e.g., control circuitry 102 in FIG. 1, coupled to a number of logical units 270-A, 270-B, 270-C, 270-D, 270-E, and 270-F. With respect to the embodiment illustrated in FIG. 1, the number of logical units 270-A, 270-B, 270-C, 270-D, 270-E, and 270-F can be located in one or more memory arrays 130. Control circuitry 202 is coupled to logical units 270-A and 270-B with control inputs 241-1. Control circuitry 202 is coupled to logical units 270-C, 270-D, 270-E, and 270-F with control inputs 241-2. Logical units 270-A and 270-B can be individual dice, while logical units 270-C and 270-D, as well as logical units 270-E and 270-F can be stacked dice. Each die can include one or more arrays of memory cells.

In one or more embodiments of the present disclosure, control circuitry 202 can be configured to control more than one logical unit with one command, e.g., a single command. For example, control circuitry 202 can control logical units 270-A and 270-B with one command issued across control inputs 241-1. As another example, control circuitry 202 can control logical units 270-C, 270-D, 270-E, and 270-F with one command issued across control inputs 241-2. In one or more embodiments, control circuitry 202 can issue a command across control inputs 241-2 such that it controls any one, two, three, or all four logical units 270-C, 270-D, 270-E, and 270-F. Details of such commands and controls are described in more detail herein.

Figure 2B:
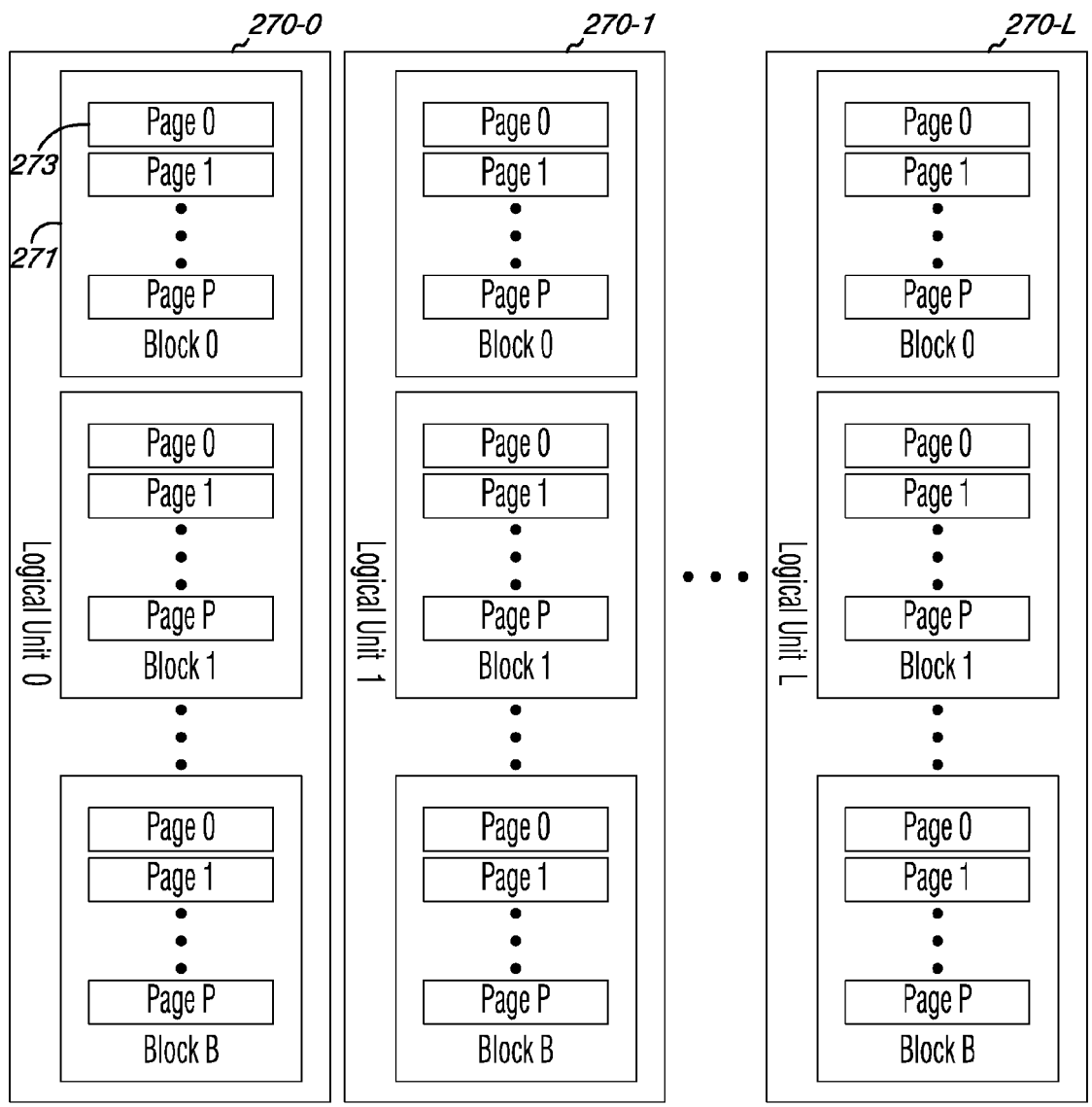
FIG. 2B illustrates a block diagram of a memory architecture in accordance with one or more embodiments of the present disclosure.

FIG. 2B illustrates a block diagram of a memory architecture in accordance with one or more embodiments of the present disclosure. The memory architecture shown in FIG. 2B includes a number of logical units such as "Logical Unit 0" 270-0, "Logical Unit 1" 270-1, . . . , "Logical Unit L" 270-L. Logical units 270-0, 270-1, . . . , 270-L can be analogous to the logical units 270-A, 270-B, 270-C, 270-D, 270-E, and 270-F illustrated in FIG. 2A. Each logical unit can include a number of blocks, such as "Block 0" 271 illustrated in Logical Unit 0 270-0. Each block can include a number of pages of memory cells, such as "Page 0" 273 illustrated in Block 0 of Logical Unit 0 270-0. Although not illustrated in FIG. 2B, a memory device can also include a number of planes, dice, and other groups of memory cells. As an example, a 128 GB memory device can include 4314 bytes of data per page, 128 pages per block, 2048 blocks per plane, and 16 planes per device.

Each page of memory cells can include a number of memory cells, e.g., non-volatile memory cells. As used herein, a page of memory cells means a number of memory cells which can store an amount of data programmable at one time. As an example, the amount of data programmable at one time can be referred to as a page of data, and the memory cells which store the page of data can be referred to as a page of memory cells. In one or more embodiments, a page of memory cells can include memory cells coupled to a particular access line, e.g., word line. In one or more embodiments, memory cells coupled to a particular word line can be divided into more than one page, e.g., into an "even" page and an "odd" page of data. In one or more embodiments, a page of memory cells can include memory cells coupled to more than one word line. As used herein, a block of memory cells means a number of memory cells which can store an amount of data erasable at one time. For example, the amount of data erasable at one time can be referred to as a block of data, and the memory cells which store the block of data can be referred to as a block of memory cells.

Figure 3:
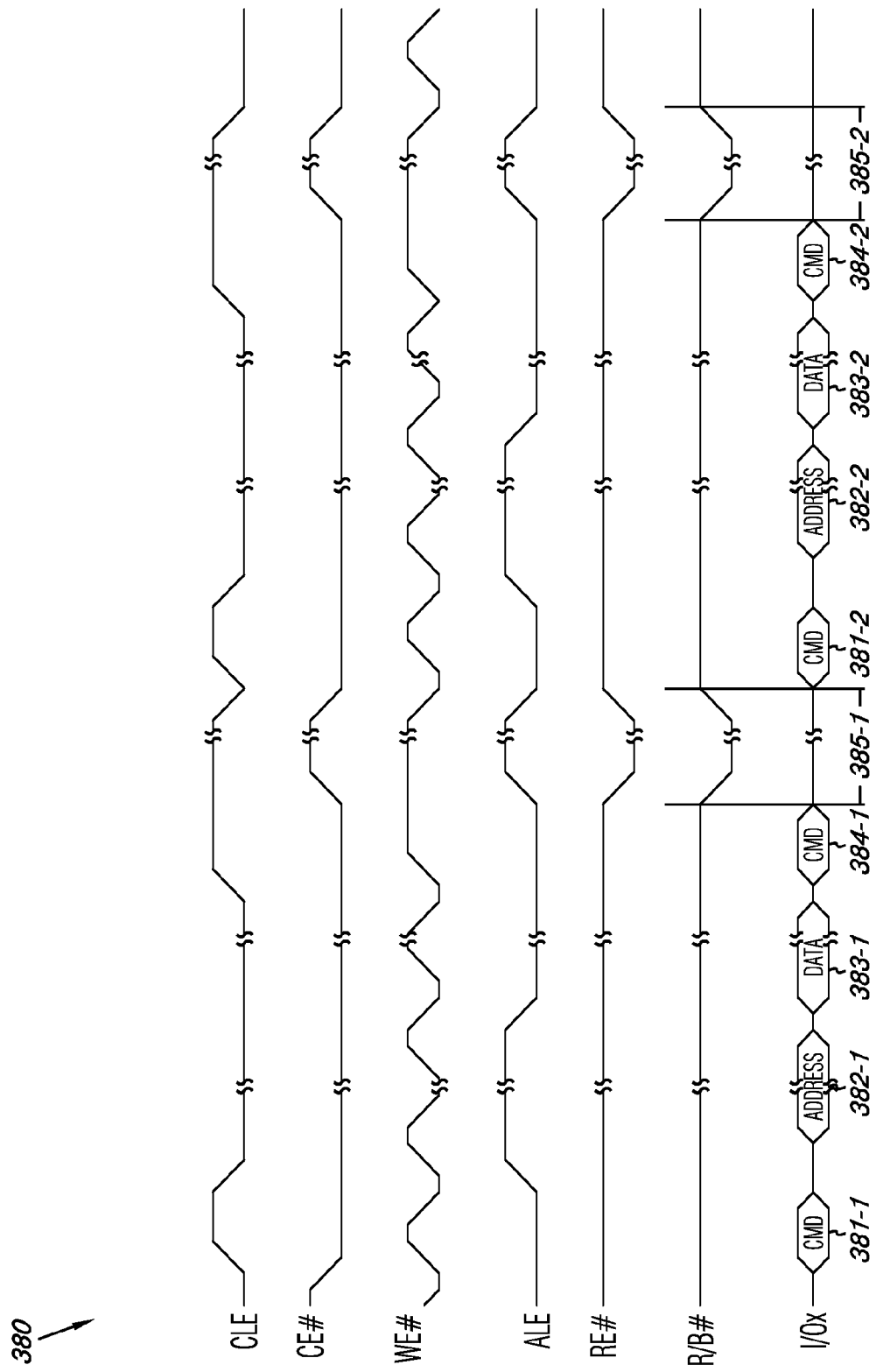
FIG. 3 illustrates a prior art timing diagram of various signals during operation of a memory device.

FIG. 3 illustrates a prior art timing diagram 380 of various signals during operation of a memory device. More particularly, timing diagram 380 illustrates signals associated with a programming operation, e.g., a write operation, for writing data redundantly to two logical units that share control signals CLE, CE#, WE#, ALE, RE#, and R/B#. Signals can include a command latch enable (CLE) signal, a chip enable (CE#) signal, a write enable (WE#) signal, an address latch enable (ALE) signal, a read enable (RE#) signal, and a ready/busy (R/B#) signal. Information communicated across input/output circuitry, e.g., an input/output bus, is illustrated by I/Ox.

As one of ordinary skill in the art will appreciate, the "#" symbol indicates a particular signal being active in a LOW logic state.

The CLE signal can be used to load a command from a bus into a command register. The CE# signal and can enable or disable a logical unit, e.g., a die, of memory. The WE# signal can transfer commands, addresses, and serial data from a memory access device (e.g., processor, memory controller, control circuitry, host system, etc.), to the memory. For example, the WE# signal can be used to provide a timing reference to a memory device. Timing chains that are activated by the control signals (e.g., ALE and CLE) can be used to control the timing of communications transfers. The memory access device can use control signals to indicate to the memory device when requests for data transactions are sent. The ALE signal can be used to load an address from a bus into an address register. The RE# signal can transfer serial data from the memory to a host system.

Various control signals coordinate communication of a command, address and other information, and data across a memory interface. According to the previous approach illustrated in FIG. 3, a programming operation can include a data input command 381-1, e.g., serial data input, sent across the I/O bus, followed by address information 382-1, e.g., a number of address cycles 382-1 containing information to identify a particular logical unit or other location in memory, and then by the data 383-1. In the illustration of FIG. 3, address information 382-1 identifies a first logical unit. Address information communicated during the address cycle 382-1, can be latched in an address register and further directed to a column decode and/or a row decode, which in turn, drives selection of one or more memory cells. Data 383-1 can be written to or read from memory through a cache register and data register. Control logic can load status information into a status register, which may be further communicated to I/O control.

According to the previous approach illustrated in FIG. 3, once the data has been input, e.g., to a register, a program command 384-1 can issue to begin programming of the data to the location(s) included in the address 382-1, e.g., from the register to a location in memory. Timing diagram 380 includes an indication of the time 385-1 during which data is programmed to the memory device. Such programming time 385-1 can be associated with a time during which the ready/busy signal R/B# associated with the logical unit to which data is being programmed being LOW. Although not illustrated in timing diagram 380, a programming operation may be followed by one or more program verify operations, read status operations, or other operations to facilitate improved data reliability.

As described above, timing diagram 380 includes signals associated with programming data redundantly to two logical units. Accordingly, after data is programmed to the first logical unit during time 385-1, a second serial data input command 381-2 can be issued, accompanied by address information 382-2, which identifies the second logical unit, and the redundant copy of data 383-2. Data 383-2 can be followed by programming command 384-2 to program the redundant copy of data to the second logical unit during programming time 385-2. As illustrated in timing diagram 380, some prior art approaches to programming data redundantly to two logical units involve issuing two data input commands and two sets of address information (for the two logical units), clocking data across an I/O bus twice, issuing two programming commands, and programming the data to two different logical units at separate times.

Figure 4:
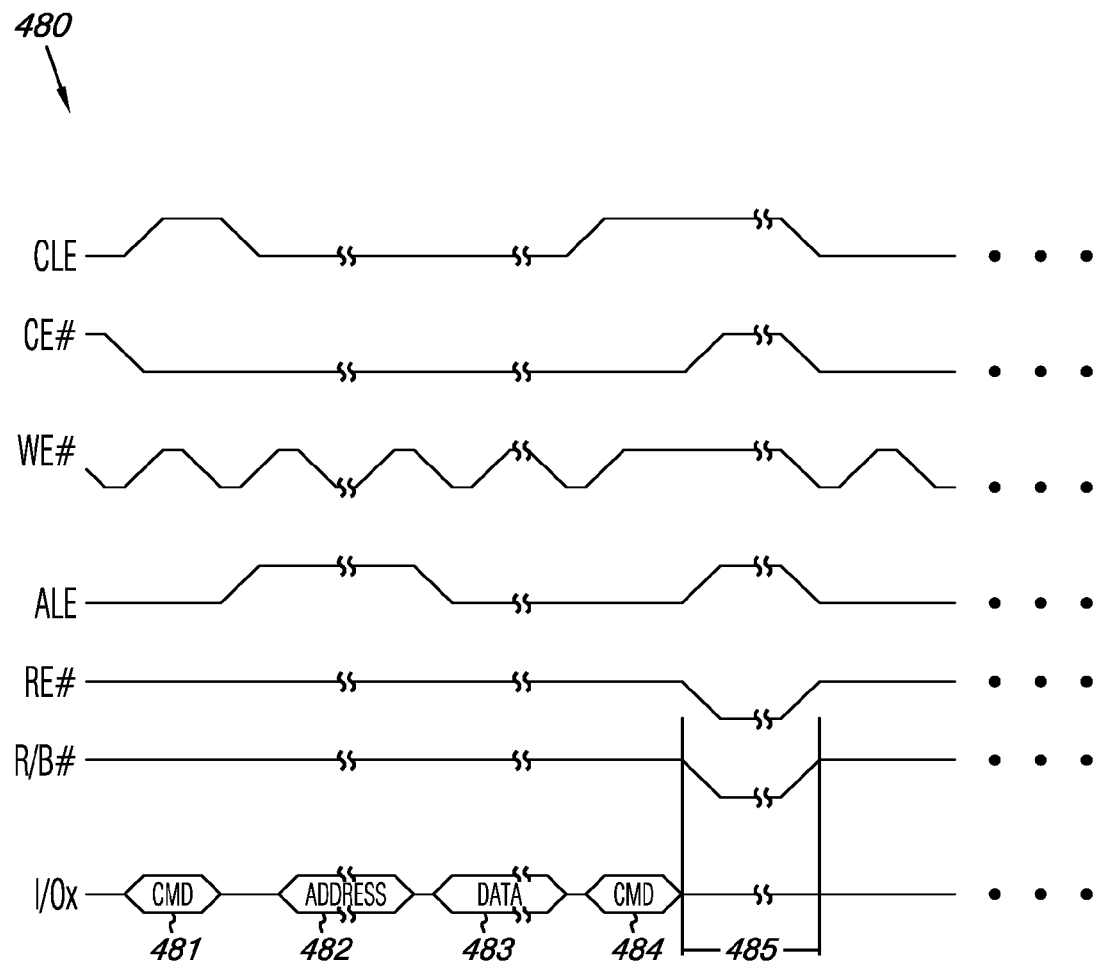
FIG. 4 illustrates a timing diagram of various signals during operation of a memory device in accordance with one or more embodiments of the present disclosure.

FIG. 4 illustrates a timing diagram 480 of various signals during operation of a memory device in accordance with one or more embodiments of the present disclosure. More particularly, FIG. 4 illustrates signals associated with a programming, e.g., write, operation for writing data redundantly to two logical units that share control signals CLE, CE#, WE#, ALE, RE#, and R/B#. Such signals can be analogous to those described with respect to FIG. 3.

According to one or more embodiments of the present disclosure, more than one logical unit can be controlled with one of a number of commands, e.g., a single programming command. Thus, in the embodiment illustrated in FIG. 4, a data input command 481 can be sent across the I/O bus followed by address information 482 and data 483. The data 483 can be followed by one programming command 484, which can program the data 483 during programming time 485 to both first and second logical units, and is indicated by R/B# being LOW during programming time 485. Programming time 485 for programming data to two or more logical units can be substantially similar or equal to programming time 385-1 illustrated in FIG. 3 for programming data to one logical unit, assuming that the same data, or same amount of data, is being programmed.

Address information 482 can identify a location in memory, e.g., a logical unit. An example of information included with address information 482 is illustrated in FIG. 5. Address information can be transferred across the I/O bus to an address register in a number of cycles, e.g., 8 bit or 16 bit cycles, however embodiments are not limited to a particular type or amount of data transfer of the address information 482. For embodiments that cycle address information, each cycle can be associated with a rising edge of the WE# signal. Timing diagram 480 includes a break in the illustration of address information 482, and corresponding portions of other signals, to illustrate that a number of address cycles can be used to indicate a location in memory. Although the address information 482 corresponds to only one logical unit, more than one logical unit can be controlled by command 484, e.g., a single programming command, which is associated with the address.

In one or more embodiments, more than one logical unit can be controlled by one or more commands associated with the address information 482 when control circuitry is configured to mask at least a portion of the address 482. In one or more embodiments, more than one logical unit can be controlled without regard to at least the portion of the address 482. The portion of the address can be a portion of the address that identifies the logical unit. As described below in connection with FIG. 5, address information 482 can include a number of portions that identify locations in memory, e.g., a logical unit, a die, a plane, a block, a page, or some other portion of memory. In one or more embodiments, the number of logical units that are controlled by the one or more commands associated with the address information 482 can be controlled simultaneously.

In one or more embodiments, the ability of a memory device to control more than one logical unit with one or more commands can be optionally enabled. An operating parameter can be set, e.g., programmed, in the memory device, e.g., during initialization of the device. For example, a "set features" command can be used to alter default power-on behavior of the memory device. The set features command can be used to program an operating parameter into a location in memory that is reserved for such information. In one or more embodiments, such operating parameters can be stored in the device until it is powered down. Setting the operating parameter can be similar to programming data, e.g., as illustrated by timing diagram 480. That is a set features command can issue, followed by address information, which can identify a portion of the memory device for which a particular operating parameter is being set. The address information can be followed by data, e.g., values representing a particular setting for the operating parameter. Such information can be clocked in through the I/O and programmed into an appropriate memory location. Once programmed, the operating parameter can be read by the device to determine operating behavior.

Embodiments are not limited to programming an operating parameter during device initialization, and such an operating parameter can be changed without powering down the device, e.g., a different operating parameter can be programmed to change the behavior of the device. For example, it may be beneficial to enable a memory device to operate more than one logical unit as controlled by a single command so that data can be programmed redundantly until a threshold of used space is met, then disable such redundant programming thereafter. Such uses of this feature are described in more detail in commonly assigned U.S. patent application Ser. No. 12/259,363 filed Oct. 28, 2008, now U.S. Pat. No. 8,291,181 issued Oct. 6, 2012, entitled "Temporary Mirroring, Logical Segregation, and Redundant Programming or Addressing for Solid State Drive Operation." Such embodiments can include setting the operating parameter to a first value and operating more than one logical unit for certain commands. Subsequently, the operating parameter can be set to a second value and the device can be operated such that there only one logical unit is controlled by each command.

In one or more embodiments, when the particular operating parameter is set such that one or more commands can control more than one logical unit, certain commands may continue to control only one logical unit. For example, programming commands, erasing commands, data move commands, cached commands, and multiple plane commands can control more than one logical unit. However, reading commands, status commands, get feature commands, and set feature commands may control only one logical unit, per their associated address information associated with such commands. Such embodiments can be useful in allowing data to be programmed to, moved from, or erased from more than one logical unit for redundancy, among other purposes. Such embodiments can also be useful in allowing one copy of the data to be read during a sensing operation to reduce the operating overhead that would be associated with sensing more than one copy of the same data.

FIG. 5 illustrates a table 590 including an address data arrangement organized into 5 cycles in accordance with one or more embodiments of the present disclosure. The data arrangement shown in FIG. 5 includes information transmitted during the address cycles (e.g., address information 482 in FIG. 4) arranged into five 8-bit portions (e.g., five address cycles "First, second, . . . , fifth"). The data arrangement shown in FIG. 5 may be communicated across an 8-bit bus using five address cycles. Embodiments of the present disclosure are not limited to this configuration, and may be arranged to have a different word length (e.g., 16 bits), including more or less bits per word so as to comprise more or fewer address cycles.

The row labeled "CYCLE" includes headers for each of the 8 I/O bits for each address cycle. The designator "CA" indicates a column address, "PA" indicates a plane address, and "BA" indicates a block address. The data arrangement shown in table 590 includes a number of unused bits (shown set LOW in FIG. 5). In the example embodiment illustrated in FIG. 5, address element "BA 19" 591 can be a die select bit and can represent a most or least significant bit in a logical unit address. Embodiments are not limited to the example illustrated in FIG. 5 as addresses can have more or less information, e.g., greater or fewer numbers of bits, and the information can correspond to memory locations other than columns, planes, and blocks.

In one or more embodiments, control circuitry that is coupled to control inputs shared by a number of logical units can be configured to mask at least a portion of an address associated with one or more commands such that the one or more commands control two or more of the number of logical units. For example, two logical units (a first logical unit and a second logical unit) could have addresses differing only by one bit, e.g., a die select bit 591 or logical unit ID bit. In such an instance, the bit 591 can be masked such that a command addressed to either the first or the second logical unit would control both the first and the second logical units.

For example, consider a first logical unit having "0011" as a portion of a logical unit address and a second logical unit having "1011" as a portion of a logical unit address. The first bit could be masked by a number of different masking operations, e.g., logical operations. For instance, the portion of the address could be operated on logically by applying a bitwise AND with "0111" such that the first bit would return a "0" for any entry in that field, e.g., bit 591. In this example, the result of the AND operation would be "0011" for either the portion of the first logical unit address or the portion of the second logical unit address. Another example can include a bitwise OR operation with "1000" such that the bit 591 would be a "1". Such an operation would yield "1011" for both the portion of the first logical unit address and the portion of the second logical unit address. The masked portion of the address can at least partially identify at least one of the number of logical units that are to be controlled by the masked address. In this example, either the first "0" or "1" is masked. That "0" or "1" can at least partially identify the first or second logical unit. That is, the bit to be masked can represent the only difference between the addresses of the first and second logical units.

Control circuitry can include additional gating, e.g., one or more AND gates, OR gates, or combinations of various logical gates to perform such masking operations. Additional gating can be located in control circuitry including command decoders, address registers, command registers, or other locations in the memory device depending on the particular implementation. Other masking operations are possible, as will be understood by one of ordinary skill in the art having read and understood the present disclosure. Additionally, the address can be modified, e.g., by adding or subtracting a value therefrom such that it corresponds to two or more logical units. As described above, such a masking operation can be optionally enabled based on, for example, an operating parameter being set to a particular value. In one or more embodiments, only one bit of one or more addresses is masked. Regardless of how many bits are used to identify a particular logical unit, masking only one bit can provide control over two logical units. For embodiments where simultaneous control is desired over more than two logical units, more than one bit can be masked.

In one or more embodiments, control circuitry that is coupled to control inputs shared by a number of logical units can be configured to send one or more commands to two or more logical units without regard to at least a portion of an address associated with one or more commands such that the one or more commands control the two or more logical units. For example, two logical units (a first logical unit and a second logical unit) could have addresses differing only by one bit, e.g., a die select bit 591 or logical unit ID bit. In such an instance, control circuitry can send a command to both the first and the second logical units regardless of the status of a portion of the address, e.g., whether bit 591 is a 0 or a 1. That is, the control circuitry can "ignore" at least a portion of the address, e.g., bit 591.

In one or more embodiments, the number of logical units controlled by one or more commands can share a remainder of an address identifying each logical unit, other than the portion of the address that is masked, e.g., ignored. Thus, the portion of the address that is masked and the remainder of the address can identify one of the logical units controlled by the one or more commands. That is, the logical units that are controlled by the one or more commands can share a substantial portion of the address corresponding to each logical unit. For example, in table 590, 25 bits are used, e.g., not LOW, for the address. If two logical units are controlled by masking bit 591, then the two logical units share 24 out of the 25 bits that are included in their addresses. Embodiments are not limited to memory device operations that mask only one bit of an address corresponding to a logical unit.

Figure 6:
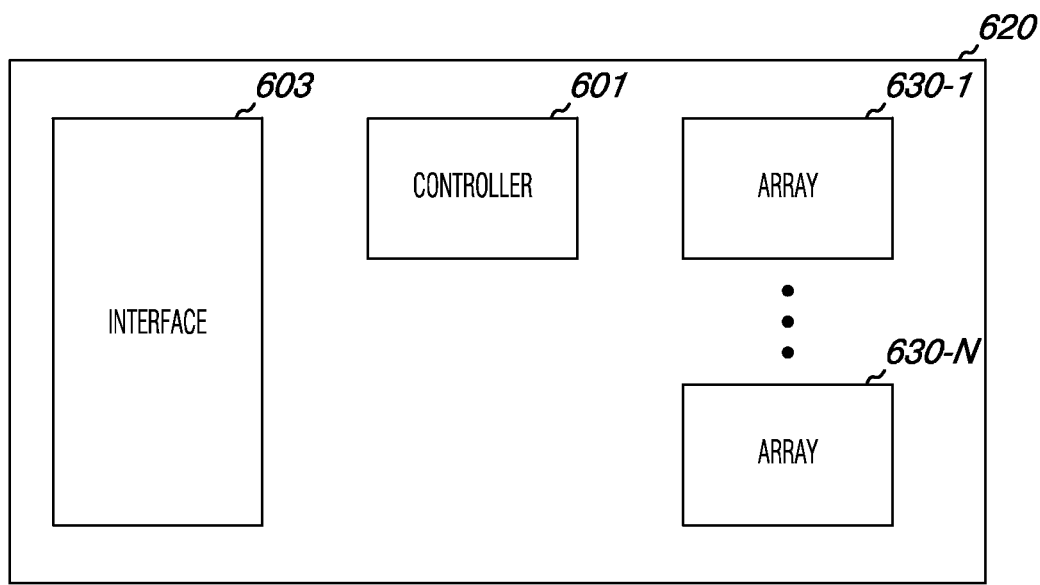
FIG. 6 illustrates a block diagram of a solid state drive in accordance with one or more embodiments of the present disclosure.

FIG. 6 illustrates a block diagram of a solid state drive 620 in accordance with one or more embodiments of the present disclosure. The embodiment of FIG. 6 illustrates the components and architecture of one embodiment of a solid state drive 620. In the embodiment illustrated in FIG. 6, the solid state drive 620 includes a controller 601, an interface 603, and solid state memory arrays 630-1, . . . , 630-N. In one or more embodiments, the solid state drive 620 can include a housing to enclose the solid state drive 620, though such housing may not be included in some embodiments.

The interface 603 can be used to communicate information between the solid state drive 620 and another device such as a computing device. For example, when the solid state drive 620 is used for data storage in a computing device, as illustrated in FIG. 3, the interface 603 can be a serial advanced technology attachment (SATA), among others.

The controller 601 can communicate with the solid state memory arrays 630-1, . . . , 630-N to sense, program, and erase data, among other operations, on the solid state memory arrays 630-1, . . . , 630-N. Controller 601 can have circuitry that may be one or more integrated circuits and/or discrete components. For one or more embodiments, the circuitry in controller 601 may include control circuitry for controlling access across a number of memory arrays and/or for providing a translation layer between an external host and the solid state drive 620. Thus, a memory controller could selectively couple an I/O connection (not shown in FIG. 6) of a memory array to receive the appropriate signal at the appropriate I/O connection at the appropriate time. Similarly, the communication protocol between a host and the solid state drive 620 may be different than what is required for access of a memory array, e.g., memory array 630-1. Memory controller 601 could then translate the command sequences received from a host into the appropriate command sequences to achieve the desired access to a memory array. Such translation may further include changes in signal voltage levels in addition to command sequences.

The circuitry of controller 601 may further include functionality unrelated to control of a memory array, e.g., array 630-1, such as logic functions as might be performed by an ASIC. Also, the circuitry of controller 601 may include circuitry to restrict sensing or programming access to the solid state drive 620, such as password protection, biometrics or the like. The circuitry of controller 601 may include circuitry to indicate a status of the solid state drive 620. For example, the circuitry of controller 601 may include functionality to determine whether power is being supplied to the solid state drive 620 and whether the solid state drive 620 is currently being accessed, and to display an indication of its status, such as a solid light while powered and a flashing light while being accessed. The circuitry of controller 601 may further include passive devices, such as decoupling capacitors to help regulate power requirements within the solid state drive 620.

Embodiments of the present disclosure can include a number of solid state memory arrays 630-1, . . . , 630-N. The solid state memory arrays 630-1, . . . , 630-N can be various types of volatile and/or non-volatile memory arrays (e.g., Flash or DRAM arrays, among others). Memory arrays 630-1, . . . , 630-N can include a number of memory cells that can be grouped in logical units such as a number of individual or stacked dice.

In one or more embodiments, the solid state drive can implement wear leveling to control the wear rate on the memory arrays 630-1, . . . , 630-N. As one of ordinary skill in the art will appreciate, wear leveling can increase the life of a solid state memory array since a solid state memory array can experience failure after a number of program and/or erase cycles.

In various embodiments, wear leveling can include dynamic wear leveling to minimize the amount of valid blocks moved to reclaim a block. Dynamic wear leveling can include a technique called garbage collection in which blocks with a number of invalid pages (i.e., pages with data that has been re-written to a different page and/or is no longer needed on the invalid pages) are reclaimed by erasing the block. Static wear leveling includes writing static data to blocks that have high erase counts to prolong the life of the block.

In some embodiments, a number of blocks can be designated as spare blocks to reduce the amount of write amplification associated with writing data in the memory array. A spare block can be a block in a memory array that can be designated as a block where data can not be written. Write amplification is a process that occurs when writing data to solid state memory arrays. When randomly writing data in a memory array, the memory array scans for free space in the array. Free space in a memory array can be individual cells, pages, and/or blocks of memory cells that are not programmed. If there is enough free space to write the data, then the data is written to the free space in the memory array. If there is not enough free space in one location, the data in the memory array is rearranged by erasing, moving, and rewriting the data that is already present in the memory array to a new location leaving free space for the new data that is to be written in the memory array. The rearranging of old data in the memory array is called write amplification because the amount of writing the memory arrays has to do in order to write new data is amplified based upon the amount of free space in the memory array and the size of the new data that is to be written on the memory array. Write amplification can be reduced by increasing the amount of space on a memory array that is designated as free space (i.e., where static data will not be written), thus allowing for less amplification of the amount of data that has to be written because less data will have to be rearranged.

In various embodiments, host and/or user traffic and/or program/erase cycles performed by the solid state drive can be monitored, in addition to wear leveling in the solid state drive, to improve performance of the solid state drive. Host and/or user traffic requests can be made by the processor through the controller to read data and/or erase/write data on the solid state drive. Program and/or erase cycles can be monitored to determine the wear rate and life expectancy of the blocks and/or pages in the solid state memory arrays, as a solid state memory arrays can only be erased and written to a finite number of time. Host and/or user traffic trends can be monitored and altered to allow the drive to perform for a desired operational life (e.g., a time period such as hours, days, weeks, years, etc). The solid state drive can monitor and limit the number of program and/or erase cycles performed by the solid state drive, such as to ensure a desired operational life of the drive. The solid state drive can also monitor the number of program and/or erase cycles performed over a particular time period to determine how to calculate the allowable program and/or erase cycle rate for the drive given the a number of space blocks and the desired operational life of the drive.

In addition, in some embodiments, the number of spare blocks in the solid state memory arrays of the solid state drive can be controlled to ensure operability over a desired operational life for a desired number of write IOPs per unit time. The percentage of spare blocks can be optimized for the type of data that is being programmed on the solid state drive. A solid state drive that has static data (i.e., data that is stored on the drive for long periods of time without be erased and/or rewritten) can have a lower percentage of spare blocks because there is less need to reclaim blocks in the drive due to the static nature of the data having fewer program and/or erase cycles. In a solid state drive that has dynamic data (i.e., data that is programmed and/or erased more frequently) a higher percentage of spare blocks can be used to reduce the write amplification associated with having to reclaim blocks to perform program and/or erase cycles in the memory array.

Figure 7:
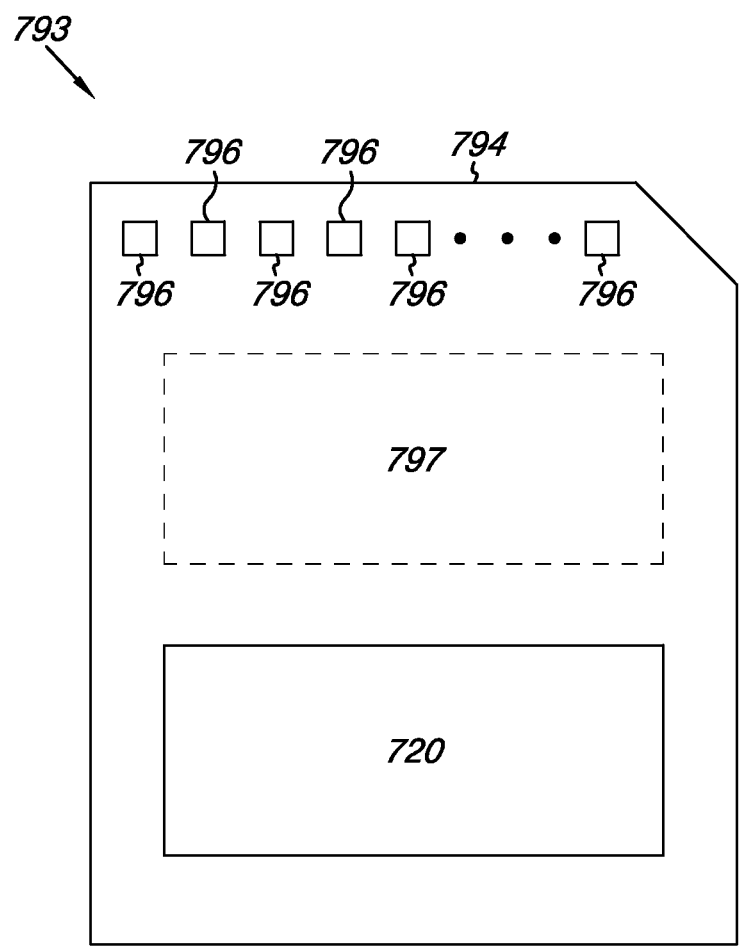
FIG. 7 is a functional block diagram of a memory module having at least one memory device in accordance with one or more embodiments of the present disclosure.

FIG. 7 is a functional block diagram of a memory module 793 having at least one memory device operated in accordance with one or more embodiments of the present disclosure. Memory module 793 is illustrated as a memory card, although the concepts discussed with reference to memory module 793 are applicable to other types of removable or portable memory (e.g., USB flash drives and/or solid-state drives) and are intended to be within the scope of "memory module" as used herein. In addition, although one example form factor is depicted in FIG. 7, these concepts are applicable to other form factors as well.

In one or more embodiments, memory module 793 will include a housing 794 (as depicted) to enclose one or more memory devices 720, though such a housing is not essential to all devices or device applications. At least one memory device 720 includes an array of non-volatile multilevel memory cells. Where present, the housing 794 includes one or more contacts 796 for communication with a host device. Examples of host devices include digital cameras, digital recording and playback devices, PDAs, personal computers, memory card readers, interface hubs and the like. For one or more embodiments, the contacts 796 are in the form of a standardized interface. For example, with a USB flash drive, the contacts 796 might be in the form of a USB Type-A male connector. For one or more embodiments, the contacts 796 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 796 provide an interface for passing control, address and/or data signals between the memory module 793 and a host having compatible receptors for the contacts 796.

The memory module 793 may optionally include additional circuitry 797, which may be one or more integrated circuits and/or discrete components. For one or more embodiments, the additional circuitry 797 may include control circuitry, such as a memory controller, for controlling access across multiple memory devices 720 and/or for providing a translation layer between an external host and a memory device 720. For example, there may not be a one-to-one correspondence between the number of contacts 796 and a number of connections to the one or more memory devices 720. Thus, a memory controller could selectively couple an I/O connection (not shown in FIG. 7) of a memory device 720 to receive the appropriate signal at the appropriate I/O connection at the appropriate time or to provide the appropriate signal at the appropriate contact 796 at the appropriate time. Similarly, the communication protocol between a host and the memory module 793 may be different than what is used for access of a memory device 720. A memory controller could then translate the command sequences received from a host into the appropriate command sequences to achieve the desired access to the memory device 720. Such translation may further include changes in signal voltage levels in addition to command sequences.

The additional circuitry 797 may further include functionality unrelated to control of a memory device 720 such as logic functions as might be performed by an ASIC. Also, the additional circuitry 797 may include circuitry to restrict read or write access to the memory module 793, such as password protection, biometrics or the like. The additional circuitry 797 may include circuitry to indicate a status of the memory module 793. For example, the additional circuitry 797 may include functionality to determine whether power is being supplied to the memory module 793 and whether the memory module 793 is currently being accessed, and to display an indication of its status, such as a solid light while powered and a flashing light while being accessed. The additional circuitry 797 may further include passive devices, such as decoupling capacitors to help regulate power requirements within the memory module 793.

CONCLUSION

The present disclosure includes methods and devices for logical unit operation. One device embodiment includes a number of logical units, wherein each of the number of logical units has a unique address. The device includes control circuitry coupled to the number of logical units and configured optionally to control more than one of the number of logical units with one of a number of commands and one address.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
 a number of logical units, wherein each of the number of logical units has a unique address; and
 control circuitry coupled to the number of logical units, wherein the control circuitry, in response to an operating parameter being set to a particular value and until the operating parameter changes to a different value, issues one command to program simultaneously more than one of the number of logical units, wherein address information associated with the one command corresponds to only one of the more than one of the number of logical units.

2. The device of claim 1, wherein:
 the device includes input/output (I/O) circuitry coupled to the number of logical units and to the control circuitry; and
 the control circuitry transfers data associated with the one command across the I/O circuitry only once to the more than one of the number of logical units such that each of the more than one of the number of logical units receives the data redundantly.

3. The device of claim 1, wherein the one command comprises a cached command or a multiple plane command.

4. The device of claim 1, wherein the control circuitry issues a reading command to only one of the number of logical units.

5. The device of claim 4, wherein the control circuitry issues status commands, get feature commands, and set feature commands to only one of the number of logical units.

6. The device of claim 1, wherein each of the more than one of the number of logical units are selected from the group of logical units including:
 one or more dice of memory cells; and
 more than one stacked dice of memory cells.

7. A memory device, comprising:
 a number of logical units, wherein at least two of the number of logical units share one or more control inputs;
 control circuitry coupled to the one or more control inputs and, wherein the control circuitry, in response to an operating parameter being set to a particular value and until the operating parameter changes to a different value, masks at least a portion of an address associated with one command such that the one command is issued to two or more of the number of logical units to program the two or more of the number of logical units simultaneously, wherein the address, prior to being masked, identifies only one of the two or more of the number of logical units.

8. The device of claim 7, wherein the control circuitry masks at least the portion of the address based on an operating parameter programmed in the device.

9. The device of claim 7, wherein the portion of the address includes one or more die select bits.

10. The device of claim 7, wherein the portion of the address includes only one bit.

11. The device of claim 7, wherein the portion of the address at least partially identifies at least one of the two or more of the number of logical units.

12. The device of claim 7, wherein the control circuitry includes one or more logic gates that mask the portion of the address.

13. The device of claim 7, wherein the control circuitry transfers the one command across input/output (I/O) circuitry and subsequently transfers the masked address across the I/0 circuitry.

14. A memory device, comprising:
 a number of logical units, wherein at least two of the number of logical units share one or more control inputs;
 control circuitry coupled to the one or more control inputs, wherein the control circuitry, in response to an operating parameter being set to a particular value and until the operating parameter changes to a different value, sends one command to the at least two of the number of logical units without regard to at least a portion of an address associated with the one command that corresponds to only one of the at least two of the number of logical units; and
 wherein the one command simultaneously programs the at least two of the number of logical units.

15. The device of claim 14, wherein the at least two of the number of logical units share a remainder of the address.

16. The device of claim 15, wherein the portion and the remainder together identify one of the at least two of the number of logical units.

17. The device of claim 14, wherein:
 the address identifies one of the at least two of the number of logical units; and
 the control circuitry sends the one command to the at least two of the number of logical units.

18. The device of claim 14, wherein a respective one of the number of logical units include all memory cells coupled to a respective one of the one or more control inputs.

19. The device of claim 14, wherein each logical unit includes one or more semiconductor dies, wherein each semiconductor die includes one or more arrays of nonvolatile memory cells.

20. The device of claim 14, wherein the one or more control inputs include address latch enable (ALE), chip enable (CE), read enable (RE), ready/busy (R/B), write protect (WP), and input/output (JO) connections.

21. A method for operating a memory device, comprising:
 receiving a command and an address corresponding only to one logical unit; and
 issuing the command to the one logical unit and at least one additional logical unit to program the one logical unit and the at least one additional logical unit simultaneously according to the address when an operating parameter is set to a particular value.

22. The method of claim 21, including setting the operating parameter to the particular value during initialization of the memory device.

23. The method of claim 21, wherein:
 receiving the command includes receiving a programming command; and
 the method includes transferring data associated with the programming command across input/output circuitry only one time for programming to the one logical unit and the at least one additional logical unit.

24. The method of claim 21, wherein receiving the command does not include receiving a reading command.

25. The method of claim 21, wherein programming the one logical unit and the at least one additional logical unit includes programming more than one logical unit, each having an address that shares a substantial portion of the address corresponding to the one logical unit.

26. The method of claim 21, wherein receiving the command and the address includes receiving the command and the address by control circuitry of the memory device from a host.

27. A method for operating a memory device, comprising:
  masking at least a portion of an address when an operating parameter is set to a particular value, wherein the address is associated with a command and corresponds to only one logical unit; and
  issuing the command to two or more logical units to program the two or more logical units simultaneously, wherein the two or more logical units correspond to the masked address.

28. The method of claim 27, wherein masking at least the portion of the address includes performing a logical operation on the address.

29. The method of claim 28, wherein performing the logical operation includes performing at least one selected from the group of logical operations including:
  a bitwise AND operation; and
  a bitwise OR operation.

30. The method of claim 27, wherein masking at least the portion of the address includes modifying at least the portion of the address such that it corresponds to the two or more logical units.

31. The method of claim 27, wherein issuing the command to the two or more logical units simultaneously includes issuing the command to the two or more logical units with a respective control input coupled to each respective one of the two or more logical units, and wherein each respective one of the two or more logical units includes all memory cells coupled to the respective control input.

32. A method for operating a memory device, comprising:
  setting an operating parameter to a first value;
  receiving a first command and a first address corresponding only to a first logical unit;
  issuing the first command to the first logical unit and at least one other logical unit to program the first logical unit and the at least one other logical unit simultaneously according to the first address;
  setting the operating parameter to a second value subsequent to setting the operating parameter to the first value;
  receiving a second command and the first address corresponding only to the first logical unit; and
  issuing the second command only to the first logical unit according to the first address.

33. The method of claim 32, wherein setting the operating parameter includes programming data to a portion of the memory device reserved for storing one or more operating parameters.

34. The method of claim 32, wherein setting the operating parameter includes transferring a command, an address cycle, and a number of data cycles across input/output circuitry of the memory device during initialization of the memory device.

* * * * *

UNITED STATES PATENT AND TRADEMARK OFFICE
CERTIFICATE OF CORRECTION

PATENT NO.         : 8,762,621 B2                                       Page 1 of 1
APPLICATION NO.    : 12/259380
DATED              : June 24, 2014
INVENTOR(S)        : Troy A. Manning It is certified that error appears in the above-identified patent and that said Letters Patent is hereby corrected as shown below:

In the Claims

In column 14, line 3, in Claim 13, delete "I/0" and insert -- I/O --, therefor.

In column 14, line 41, in Claim 20, delete "(JO)" and insert -- (IO) --, therefor.

Signed and Sealed this
Twenty-sixth Day of August, 2014

Michelle K. Lee
*Deputy Director of the United States Patent and Trademark Office*